United States Patent
Brebøl

(10) Patent No.: US 6,707,235 B1
(45) Date of Patent: Mar. 16, 2004

(54) PIEZOELECTRIC TRANSFORMER

(75) Inventor: Klaus Brebøl, Langebæk (DK)

(73) Assignee: Noliac A/S, Kvistgaard (DK)

( * ) Notice: Subject to any disclaimer, the term of this patent is extended or adjusted under 35 U.S.C. 154(b) by 0 days.

(21) Appl. No.: 09/659,490

(22) Filed: Sep. 11, 2000

(51) Int. Cl.$^7$ .................. H01L 41/08; H01L 41/18; H02N 2/00
(52) U.S. Cl. .................. 310/369; 310/365; 310/357
(58) Field of Search .................. 310/369, 365, 310/357

(56) References Cited

U.S. PATENT DOCUMENTS

| | | | | |
|---|---|---|---|---|
| 3,562,563 | A | * 2/1971 | Schafft | 310/9.5 |
| 3,736,446 | A | 5/1973 | Berlincourt et al. | 310/8 |
| 3,781,955 | A | * 1/1974 | Lavrinenko et al. | 29/25.35 |
| 4,284,921 | A | * 8/1981 | Lemonon et al. | 310/328 |
| 4,401,911 | A | * 8/1983 | Ravinet et al. | 310/800 |
| 4,525,645 | A | * 6/1985 | Shirley et al. | 310/337 |
| 4,759,107 | A | * 7/1988 | Ogawa et al. | 29/25.35 |
| 5,045,744 | A | * 9/1991 | Ando et al. | 310/320 |
| 5,081,391 | A | * 1/1992 | Owen | 310/334 |
| 5,118,982 | A | 6/1992 | Inoue et al. | 310/366 |
| 5,241,236 | A | * 8/1993 | Sasaki et al. | 310/358 |
| 5,814,922 | A | * 9/1998 | Uchino et al. | 310/359 |
| 5,852,229 | A | * 12/1998 | Joees et al. | 73/24.06 |
| 5,861,704 | A | * 1/1999 | Kitami et al. | 310/369 |
| 5,903,086 | A | 5/1999 | Ogiso et al. | 310/359 |
| 5,939,818 | A | * 8/1999 | Hakamata | 310/359 |
| 5,959,391 | A | 9/1999 | Ogiso et al. | 310/359 |
| 6,012,207 | A | 1/2000 | Ogiso et al. | 29/25.35 |
| 6,025,670 | A | * 2/2000 | Corl et al. | 310/369 |
| 6,133,673 | A | * 10/2000 | Kawara et al. | 310/320 |
| 6,201,874 | B1 | * 3/2001 | Croft et al. | 381/191 |
| 6,362,559 | B1 | * 3/2002 | Boyd | 310/359 |

(List continued on next page.)

FOREIGN PATENT DOCUMENTS

| | | |
|---|---|---|
| DE | 26 50 356 | 5/1978 |
| EP | 0794580 | 9/1997 |

OTHER PUBLICATIONS

Richard Holland, excerpts from "Design of Resonant Piezo-electric Devices", Research Monograph No. 56, The M.I.T. Press Cambridge, Massachusetts and London England, 1969.

(List continued on next page.)

*Primary Examiner*—Nestor Ramirez
*Assistant Examiner*—Pedro J. Cuevas
(74) *Attorney, Agent, or Firm*—Harness, Dickey & Pierce, P.L.C.

(57) ABSTRACT

A piezoelectric transformer including a piezoelectric body which includes a primary portion and a secondary portion, both the primary portion and the secondary portion being able to generate and transform piezoelectric vibrations in accordance with an AC Voltage fed to one portion while a transformed voltage can be delivered from the other portion, the piezoelectric body being constituted by a substantially annular body the primary and secondary portions of which have been polarized substantially perpendicular to the peripheral direction of the annular body, the transformer being adapted to be operated at a resonance frequency of a dimension of a cross-section of the annular body substantially perpendicular to the peripheral direction of the annular body. A piezoelectric transformer including a piezoelectric body which includes a primary portion and a secondary portion, both the primary portion and the secondary portion being able to generate and transform piezoelectric vibrations in accordance with an AC Voltage fed to one portion while a transformed voltage can be delivered from the other portion, the electrodes of one or both portions of the piezoelectric body being embedded in their respective portion, and the piezoelectric material between the respective other portion and the embedded electrode which is closest to that other portion is used as a galvanic separation while still actively participating in the power transfer.

24 Claims, 14 Drawing Sheets

U.S. PATENT DOCUMENTS

| | | | | |
|---|---|---|---|---|
| 6,400,065 B1 | * | 6/2002 | Toda et al. | 310/334 |
| 6,411,014 B1 | * | 6/2002 | Toda | 310/334 |
| 6,426,585 B1 | * | 7/2002 | Kohno | 310/314 |
| 6,492,763 B2 | * | 12/2002 | Kim et al. | 310/358 |
| 6,495,947 B1 | * | 12/2002 | Kim et al. | 310/358 |

OTHER PUBLICATIONS

Chih–yi Lin, "Design and Analysis of Piezoelectric Transformer Converters", Jul. 15, 1997, Blacksburg, Virginia pp 1–192.

Derwent Abstract corresponding to JP 9–321363.

Derwent Abstract corresponding to JP 9–223826.

Derwent Abstract corresponding to DE 2650356.

Derwent Abstract corresponding to JP 4–167504.

Sasaki, Yasuhiro et al. "Small Multilayer Piezoelectric Transformers with High Power Density—Characteristics of Second and Third–Mode Rosen–Type Transformers–". 1999 Publication Board, Japanese Journal of Applied Physics, vol. 38 (1999), pp. 5598–5602.

Sato, J. et al. "Dependence of the electromechanical coupling coefficient on the width–to–thickness ratio of plank–shaped piezoelectric transducers used for electronically scanned ultrasound diagnostic systems." Journal of Acoustical Society of America, 66(6), Dec. 1979, pp. 1609–1611.

Osamu Ohnishi et al.; Piezoelectric Ceramic Transformer for Power Supply Operating in Thickness Extensional Vibration Mode; IEICE Transactions on Fundamentals of Electronics, Communications and Computer Sciences, No. 12, Dec. 1994; pp. 2–11.

D.A. Berlincourt; General Description of Piezoelectric Transformers; Technical Publication TP–244, pp. 1–10.

* cited by examiner

PIEZOELECTRIC TRANSFORMER

TECHNICAL FIELD

The invention relates to a piezoelectric transformer comprising a piezoelectric body which is divided into a primary portion and a secondary portion, both the primary portion and the secondary portion being able to generate and transform piezoelectric vibrations in accordance with an AC Voltage fed to one portion while a transformed voltage can be delivered from the other portion.

BACKGROUND ART

One kind of known piezoelectric transformer of this type comprises a piezoelectric body in the form of an oblong plate operated at a resonance frequency characteristic of the length of the plate. This kind of transformer, thus, operates at relatively low frequencies, which limits its power density.

U.S. Pat. No. 3,736,446 discloses an annular piezoelectric transformer. The piezoelectric material is layered by means of through-going electrodes along a portion of the periphery of this transformer, said portion being operated at oscillations in the peripheral direction. The resonance frequency is relatively low for oscillation types along the periphery. As the transformable power is proportional to the frequency, the power transformable by means of this annular transformer is relatively small.

BRIEF DESCRIPTION OF THE INVENTION

The invention relates to a piezoelectric transformer which is capable of operating effectively in a mode resulting in high frequencies (such as "thickness mode") even when it is made of a high power or high $Q_m$ piezoelectric material, without the working resonance being disturbed to any substantial extent by overtones from lower modes. In the piezoelectric transformer according to the invention, the piezoelectric body is constituted by a substantially annular body which has been polarized substantially perpendicular to the peripheral direction. An annular piezoelectric body presents three basic modes of vibration, the periphery presenting the lowest frequency and vibrations substantially perpendicular to the peripheral direction, that is, a planar vibration and a thickness vibration.

The thickness vibration (or, expressed more generally, vibration at a resonance frequency of a dimension of a cross-section of the annular body substantially perpendicular to the peripheral direction of the annular body) represents a comparatively high frequency due to the reduced extent of the determining dimension, as the cross-section of the annular body is normally relatively small compared to the outer transverse dimension of the annular body. Thus, the annular transformer of the invention is adapted to operate at a comparatively higher frequency as it operates on a transverse dimension vibration or thickness vibration instead of a peripheral vibration. Moreover, the geometry provides an increased capacity, which together with the increased operation frequency results in a reduced output impedance. Thus the transformer is able to handle increased currents, typically in the range of 0.1 to 5 A.

It is known that each of the primary and the secondary portions of a piezoelectric transformer can be subdivided in sections, and this is also the case for the transformer according to the invention.

The power in the transformer is transferred as a mechanical vibration. The maximum permissible transferred power depends on the fatigue strength of the ceramics. For a predetermined maximum mechanical strain in the ceramics the transferred power is $$P = f_{res} \cdot \epsilon \cdot vol \cdot k_{eff}^2$$

where

P=transferred power $f_{res}$=resonance frequency vol=volume $k_{eff}$=efficient piezoelectric coupling coefficient corresponding to the existing mode of vibration $\epsilon$=dielectric permittivity When two annular transformers are made of the same ceramics and have the same volume, the maximum allowable strain and $\epsilon$ vol are constant. As mentioned above, the resonance frequencies are higher for the thickness vibration than for the peripheral vibration, and as far as conventional piezoelectric ceramics of the power type is concerned, the associated coupling coefficients are 0.3 to 0.35 ($k_{31}$, peripheral vibration) and 0.40 to 0.45 ($k_T$, thickness vibration), respectively.

The difference in coupling coefficient results in an increased power density of $$(0.45/0.35)^2 = 1.65$$

and the resonance frequency is typically a factor 10 higher. Totally, the power density is increased by $1.65 \cdot 10 = 16.5$.

BRIEF DESCRIPTION OF THE DRAWINGS

The invention is explained in greater detail below with reference to the accompanying drawings, in which.

MORE DETAILED DISCUSSION OF THE PRINCIPLE OF THE INVENTION

Figure 1:
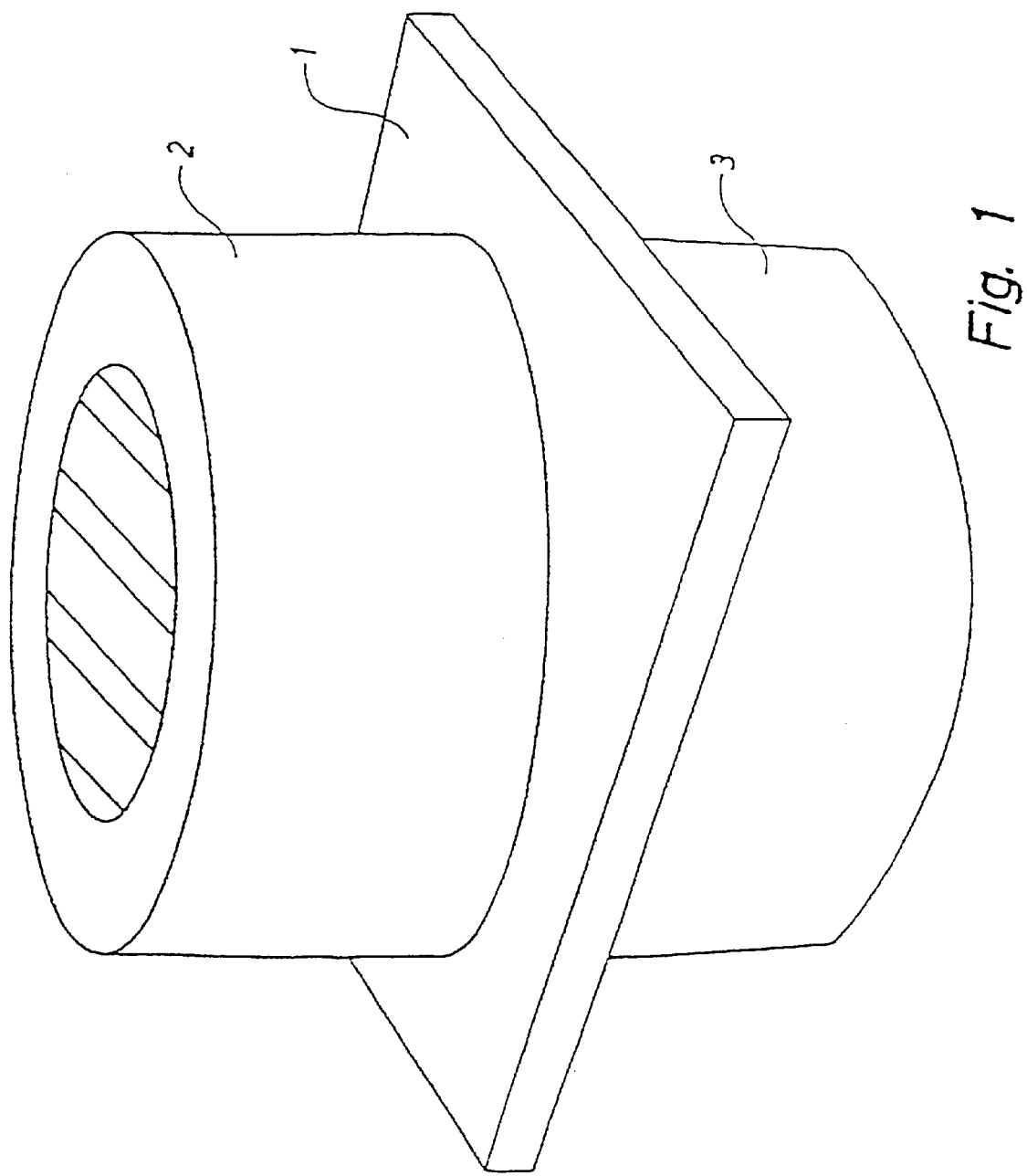
FIG. 1 illustrates a piezoelectric transformer with an annular piezoelectric body on each side of an insulating plate.

Modern semiconductor-based electronics are often run at relatively low voltages and correspondingly larger currents. Piezoelectric transformers have, since the first types thereof appeared (C. A. Rosen in H. W. Katz: "Solid State Magnetic and Dielectric Devices", John Wiley & Sons, 1959) suffered from a high impedance level, that is, they have been suitable for high voltages, but unsuitable for higher powers than 2–3 Watt, and useless for currents in the ampere range. JP-A-09-321363 (see below) improves this to some extent, but further improvements are desirable.

Based on the maximum mechanical tension that the material can resist, the maximum power density achievable in a piezoelectric transformer—all other things being equal—is given by $$P/\text{volume} \propto f_{res} \cdot \epsilon \cdot k_{eff}^2 \quad (1)$$

Thus, the power density increases proportionally to the permittivity and the resonance frequency and with the square of the coupling coefficient. The product $\epsilon \cdot k_{eff}^2$ indicates how much energy can be transformed from a given mechanical tension to an electric charge. $f_{res}$ indicates how frequently this takes place, the product thus indicating the transformed power.

The maximum mechanical tension is given from the fatigue strength of the material and a safety factor. What does not appear from equation (1) is that to the extent possible, the body should be free from other resonances than the operation resonance:

Undesired resonances coupling with the operation resonance cause mechanical tensions in the material that have nothing to do with the power transmission. Extra tension concentrations which do not contribute to the power transmission must still be taken into consideration when the transformer is designed and thereby lower the maximum power density as, seen totally, the fatigue strength of the material cannot be exceeded. In addition, these extra tensions will give rise to loss in the component and thereby to a reduced efficiency.

In addition, coupled extra resonances have a tendency to attenuate the working resonance so that is has a lower effective coupling. A lower effective coupling, $k_{eff}$, is disadvantageous in itself as the effect density is proportional to the square of $k_{eff}$, confer equation (1).

JP-A-09-321363 discloses 'a columnar shape' working in longitudinal mode. The major advantages are that it is the lowest possible frequency so that it is free from coupling to other modes. The disadvantage is that, all other things being equal, this transformer has a low resonance frequency (oblong component). This, on its side, means a low power density (equation 1).

At the same time, the component disclosed in JP-A-09 321363 will show a low capacitance (a small area/length ratio) as compared to a disc of the same volume (short component, high area/thickness ratio. A low capacitance results in a high output impedance, and thereby, makes the component unsuitable for low voltages and high currents.

A more flat geometry in the form of a disc or panel, as described in U.S. Pat. No. 5,118,982, will have a higher capacitance and will, thereby, be more useful for large currents. But this is not in itself a solution as it will have a high proportion of undesired resonances around the working resonance. In this context, reference is made to FIG. 9 which is a double logarithmic graph of impedance versus frequency for a piezoelectrical disc, outer diameter 16 mm, thickness 2 mm, with electrodes on the two major surfaces, made of Pz26, a NAVY type I-like material of high $Q_m$ (about 1000) from Ferroperm, Kvistgaard, Denmark (www.ferroperm.com). Such a transformer is difficult to operate, as there is not a single well-defined resonance with which to work, and the maximum power density becomes lower as a consequence of the lower coupling coefficient and the coupled resonances which give rise to unequal stress distribution in the material.

To utilize a flat geometry, and the consequently higher capacitance, it is necessary to control these undesired oscillations.

This can be done by using anisotropic materials (modified $PbTiO_3$) which are free from planar vibrations. But $PbTiO_3$ is not suitable for high powers, as it has lower strength and higher loss than PZT materials optimized for high power applications. In U.S. Pat. No. 5,118,982 (NEC) where a plate geometry is used, parasitic resonances are in fact avoided by using $PbTiO_3$. The patent mentions that this is to obtain a lower permittivity, and that PZT may be used, provided the transverse resonances are moved sufficiently far away from the thickness oscillation (8.30–38), but in a paper, the same authors explain how it is necessary exactly to use $PbTiO_3$ instead of PZT to avoid "spurious modes" (O. Ohnishi, Y. Sasaki, T. Zaitsu, H. Kishie, T. Inoue: *Piezoelectri Ceramic Transformer for Power Supply operating in Thickness Extensional Vibration Mode*, IEICE Trans. Fundamentals Vol E77-A, No. Dec. 12, 1994, pp20982105).

However, an optimal solution is the principle according to the present invention. The use of the ring structure permits the use of materials which are not only characterized by low electrical and mechanical losses and a high thickness coupling ($k_{33}$, $k_t$), but also materials with a high cross coupling ($k_{31}$, $k_p$), such as traditional high power materials (NAVY types I and III). The lowest resonance of a body will be proportional to its largest dimension. For a disc, this will be the diameter. The thickness resonance, which is typically a factor 10 higher than the planar oscillation, will be preferable as operational resonance (again formula 1). As suitable high power materials show low losses, there will, however, be a large number of higher harmonics for the planar oscillation, and these will typically exceed the thickness resonance, with the disadvantages described above (FIG. 9).

On the other hand, a ring will, in practice, not have any overtones to the circumference oscillation, as there is only generated a uniform stress in the material (chapter 3.1; O. E. Mattiat (Ed): "Ultrasonic Transducer Materials"; Plenum Press, New York-London, 1971, SBN 306-30501-1). Therefore, it is possible to dimension a ring so that its lowest resonance is below the operational resonance of the thickness, while, at the same time it does not generate overtones which would interfere in a disturbing manner with the thickness oscillation. That the lowest resonance can, without any problems, be below the operational resonance, means that it is possible to have an arbitrarily large cross-sectional area resulting in a low impedance level and a large volume with resulting higher total power. In addition, the height/width ratio of the cross-section of the ring may be freely changed, in this manner optimizing the thickness coupling. This technique is known from the design of ultrasonic transducers for medical use, which are rod-shaped bodies, or, expressed in another manner, a "ring not closed". (J.Sato;M.Kawabuchi;A.Fukumoto: "Dependence of the electromechanical coupling coefficient on the width-to-thickness ratio of plank-shaped piezoelectric transducers used for electronically scanned ultrasound diagnostic systems." J.Acoust.Soc.Am;Vol 66(6), December 1979, pp1609–1611.)

Figure 9:
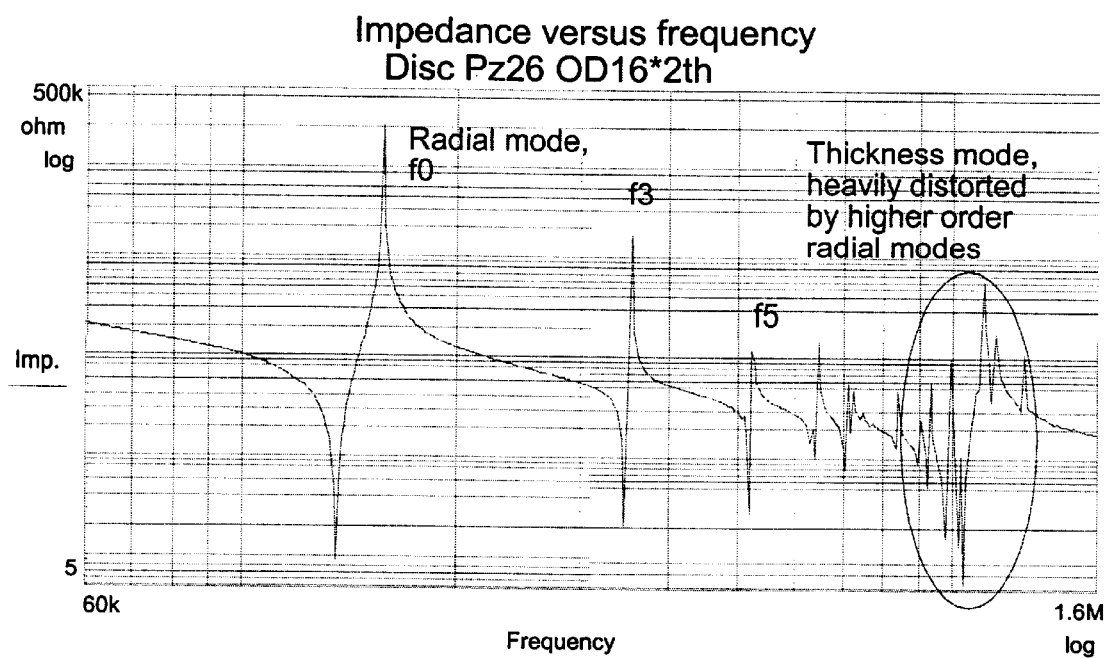
FIGS. 9–12 illustrate impedance versus frequency for various piezoelectric bodies of non-annular and annular shape, respectively.
Figure 10:
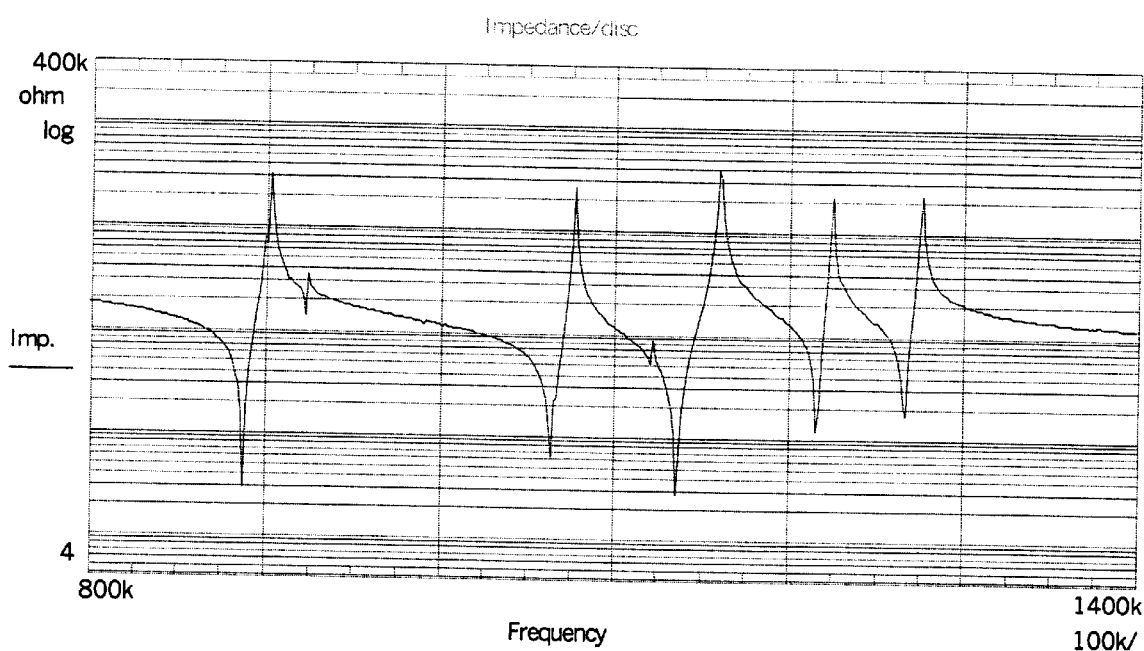
Figure 11:
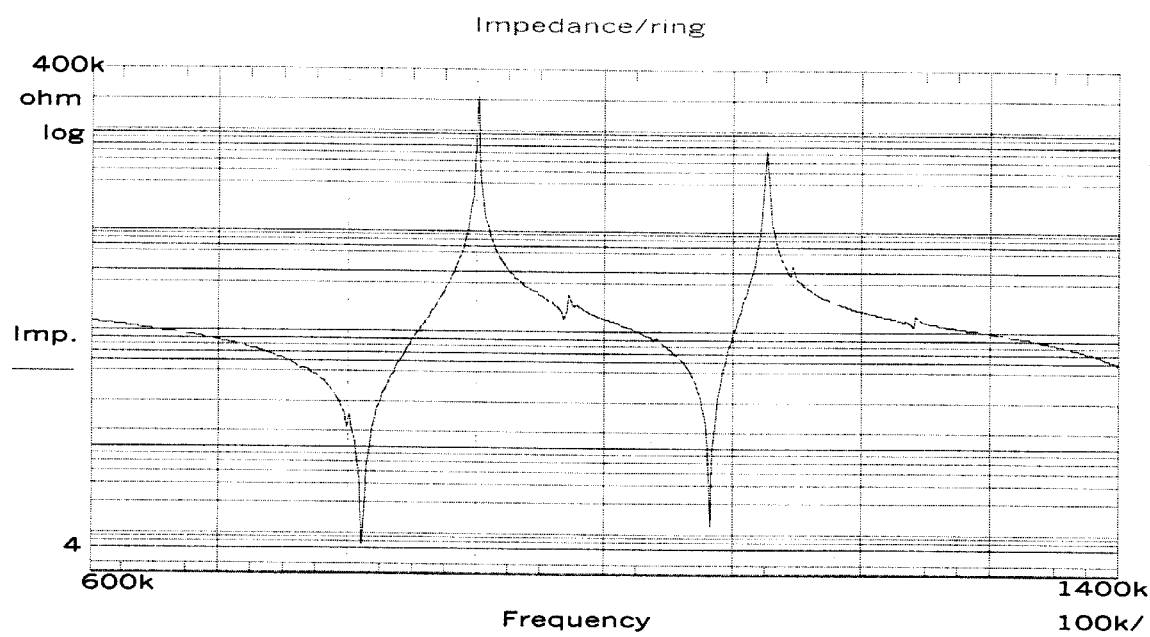

FIG. 10 (disc) and FIG. 11 (ring) show the resonances measured for a disc and a ring, respectively, of the same material as in FIG. 9, and of comparable sizes, the disc having an outer diameter of 6.35 mm and a thickness of 2 mm, and the ring having an outer diameter of 6.1 mm, an inner diameter of 2.3 mm, thickness 1.44 mm. For clarity, the frequency range of 600–1200 kHz has been zoomed into. The radial oscillation has been omitted.

It will be seen that the ring shows only two pronounced and 'pure' oscillations, whereas the disc shows several weaker resonances.

The curve will be somewhat different for a transformer, as other things must be taken into consideration than just maximum $k_{eff}$.

Figure 12:
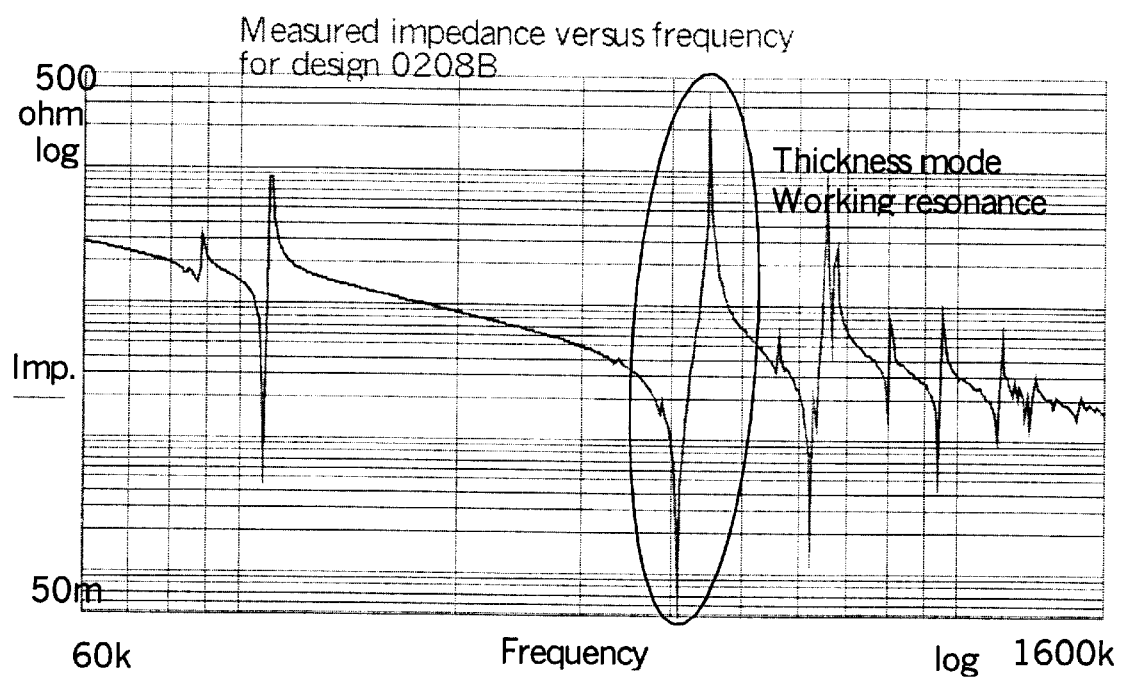

FIG. 12 shows impedance versus frequency for a ring transformer with outer diameter 12.6 mm and inner diameter 8 mm, total height 3.9 mm. It will be seen that the thickness resonance is free from superimposed resonance.

The radial oscillation around 110 kHz is without overtones, and the spectrum is free from resonances up to the first longitudinal oscillation at a little more than 400 kHz.

The absence of radial overtones in a ring design can clearly be seen when comparing with the measured impedance curve for a disc (FIG. 9).

As an example of the usefulness of the ring transformer may be mentioned a transformer with the dimensions OD 12.6 mm, length 3.9 mm. Driven by means of a sinus-shaped AC signal, 100 V RMS, 420 kHz, the transformer yields 12.1 Watt at 22.5 V, corresponding to an power density of 37 Watt/cm$^3$. The efficiency is 97%.

DESCRIPTION OF PREFERRED EMBODIMENTS

The piezoelectric transformer illustrated in FIG. 1 comprises an annular piezoelectric body on each side of an insulating plate 1. One piezoelectric body 2 serves as primary portion whereas the other piezoelectric body 3 serves as secondary portion. Electrodes are provided both at the primary portion 2 and at the secondary portion 3, and both said primary portion and said secondary portion are able to generate and transform piezoelectric vibrations in response to an AC voltage fed from one portion while the transformed voltage can be delivered from the other portion. Each piezoelectric body is shaped as a substantially annular body. As a result, an improved uniform distribution of the stresses, an increased coupling coefficient as well as improved cooling conditions are obtained. A vital factor for maximizing the efficient coupling in this and other configurations of piezoelectric transformers of the invention is that b/h is either less than 0.25 or 0.35<b/h<0.8 or especially 0.4<b/h<0.7, where b represents the width and h represents the height of the wall of the piezoelectric body, such as seen in FIG. 2.

Figure 2:
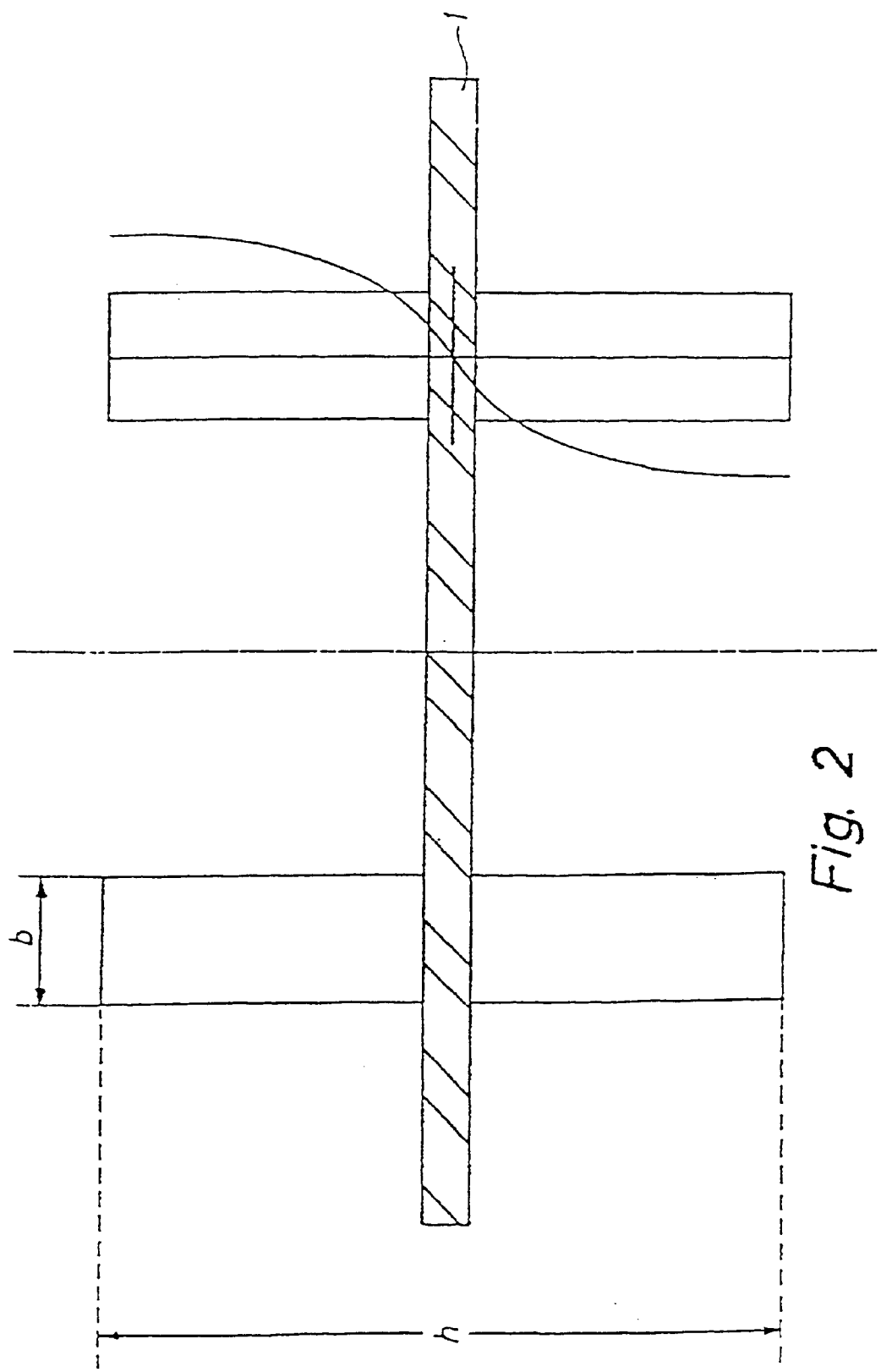
FIG. 2 is a sectional view through the transformer of FIG. 1 and illustrating the vibrations.

FIG. 2 illustrates that the transformer operates as a semiwave resonator.

Figure 3:
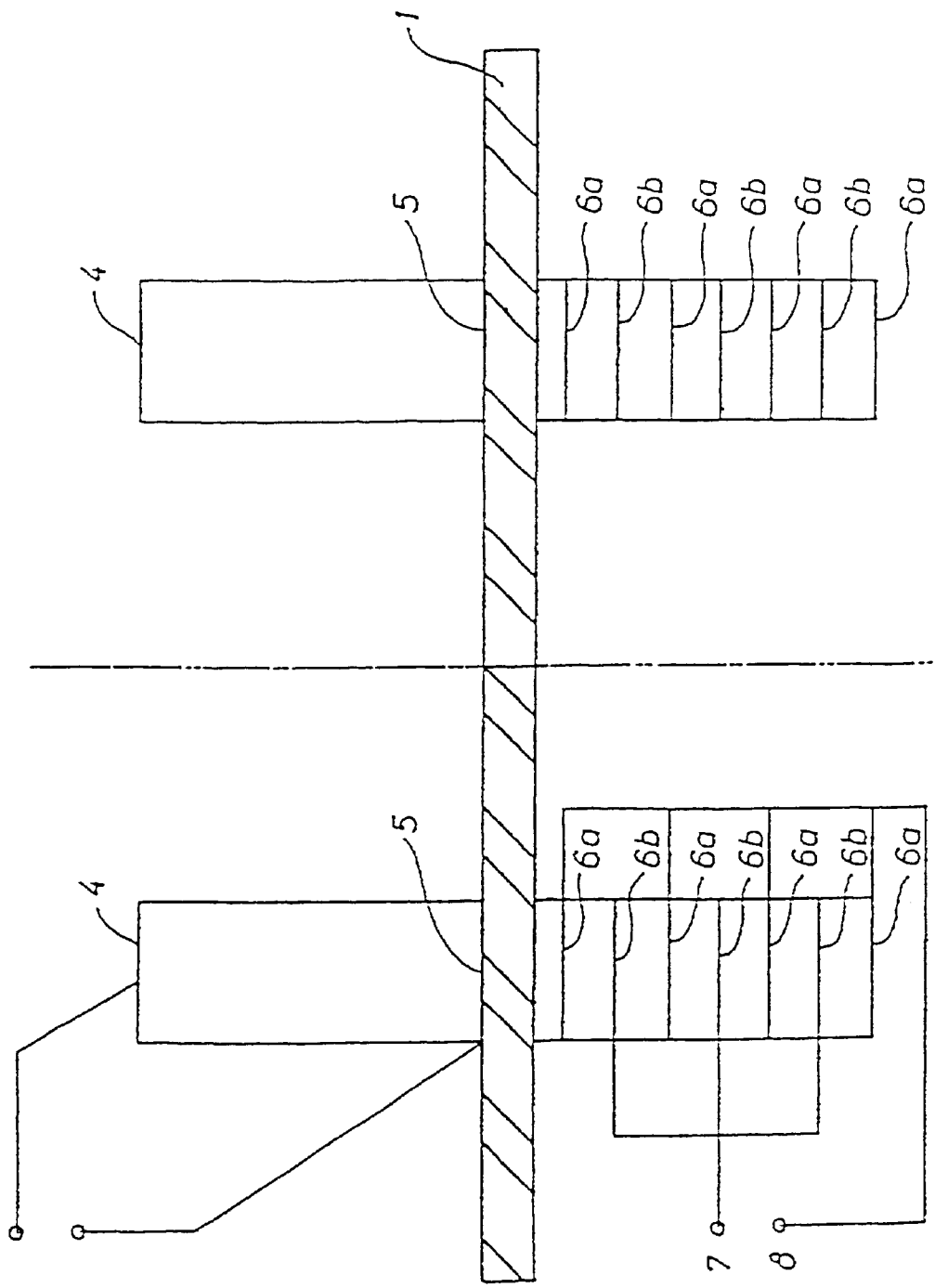
FIG. 3 is a sectional view through the transformer of FIG. 1 and illustrating the electrode configurations.

FIG. 3 illustrates an example of an electrode structure at both the primary portion and at the secondary portion. A circumferential electrode is provided on the primary portion both at the top side 4 and at the bottom side 5. The secondary portion is formed as a multilayer structure with inner electrodes 6a, 6b. These inner electrodes 6a, 6b are alternately connected to one output terminal 7 and the other output terminal 8.

Figure 4:
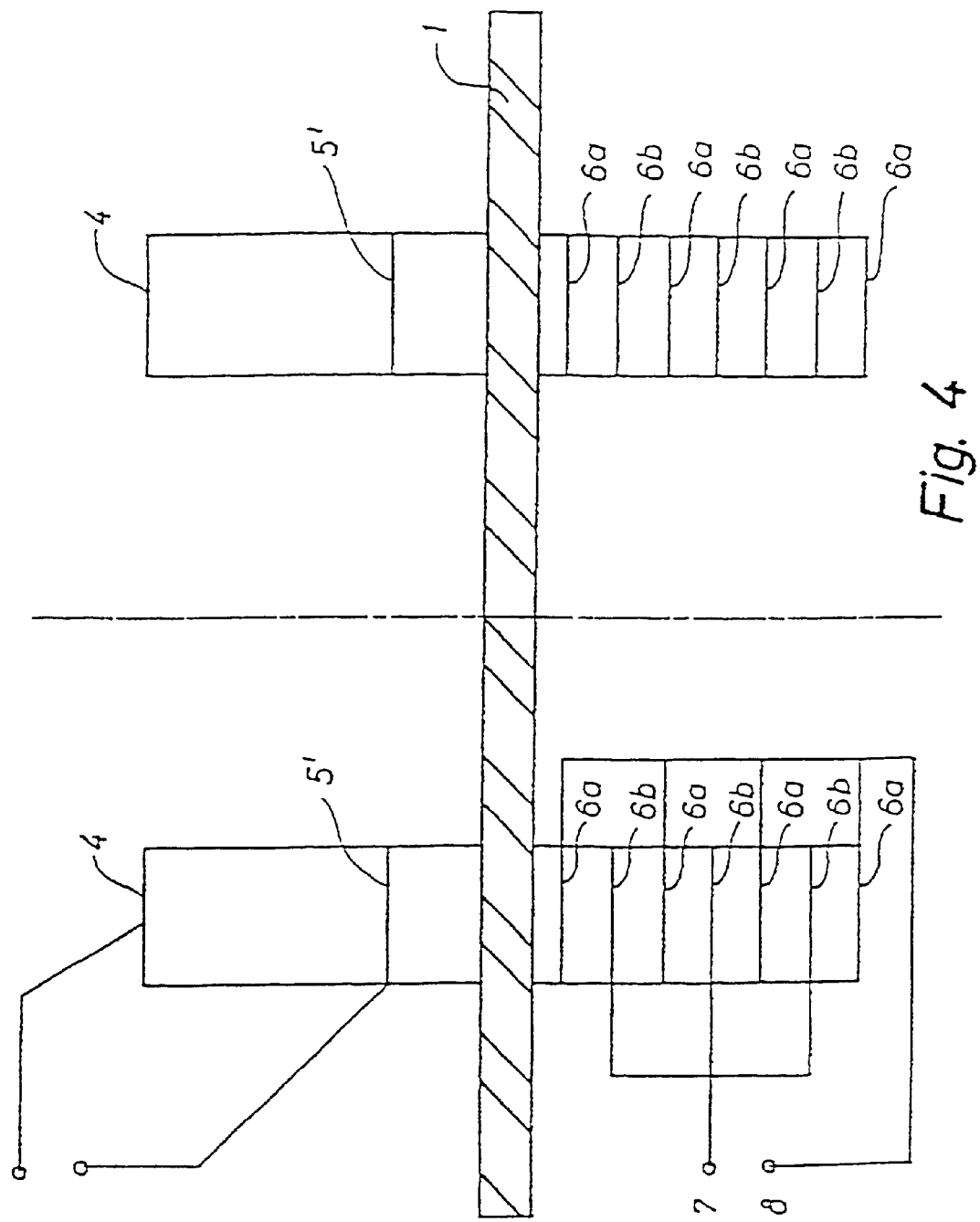
FIG. 4 is a sectional view corresponding to the sectional view of FIG. 3, where one primary electrode has been moved away from the insulating layer so as to reduce the mechanical stresses due to the polarisation.

FIG. 4, one primary electrode 5' has been moved away from the insulating layer 1 so as to reduce the mechanical stresses during the polarisation. Unlike the insulating layer 1, the ceramics is subjected to dimensional changes during the polarisation.

Figure 5:
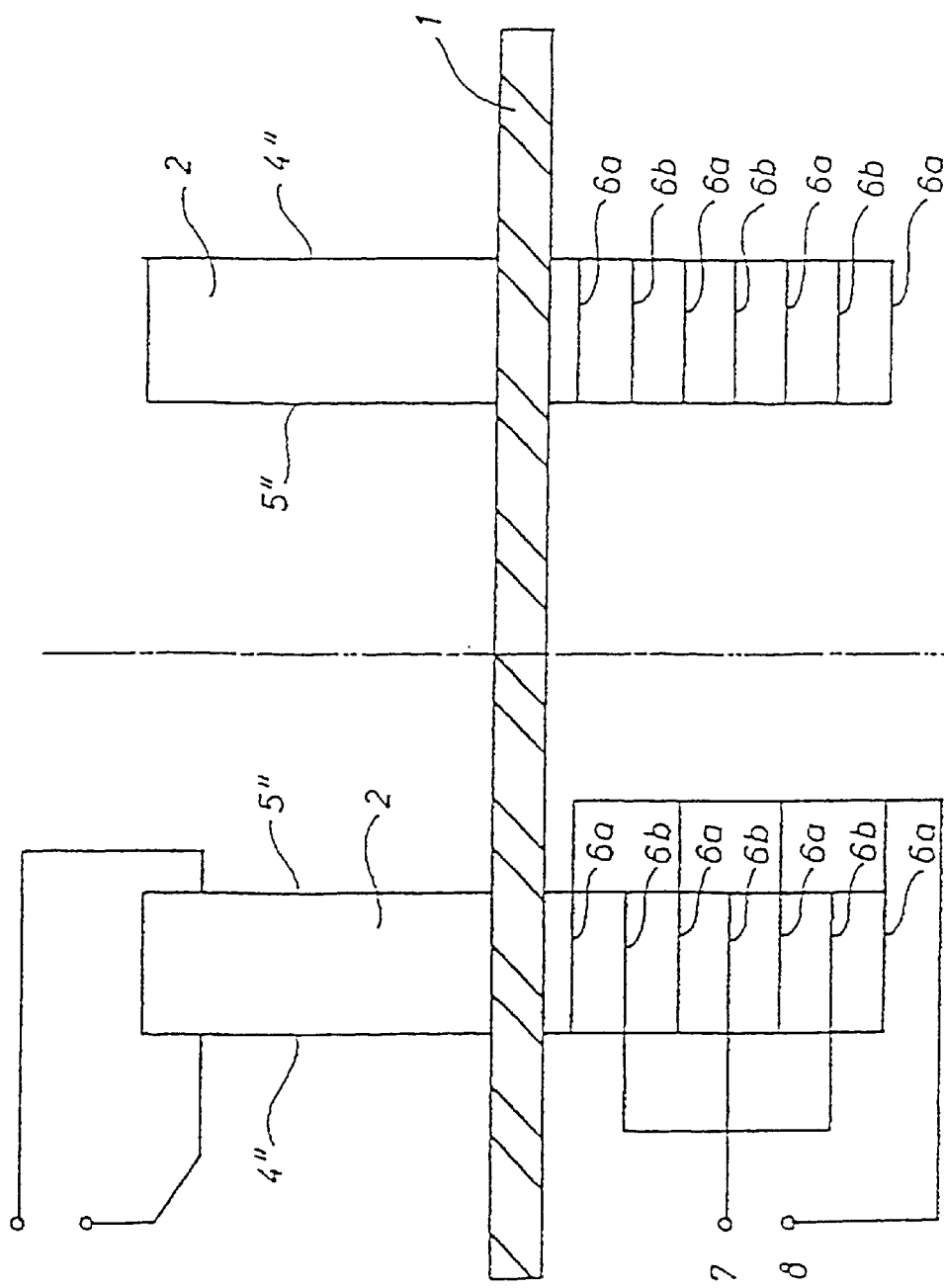
FIG. 5 is a sectional view corresponding to the sectional view of FIG. 3, but showing an alternative positioning of the primary electrodes.

FIG. 5 illustrates an alternative positioning of the primary electrodes 5" and 4", respectively, on the inner side and the outer side, respectively, of the annular body 2.

The secondary electrodes 6a, 6b are positioned in the same positions as in FIGS. 3 and 4.

Figure 6:
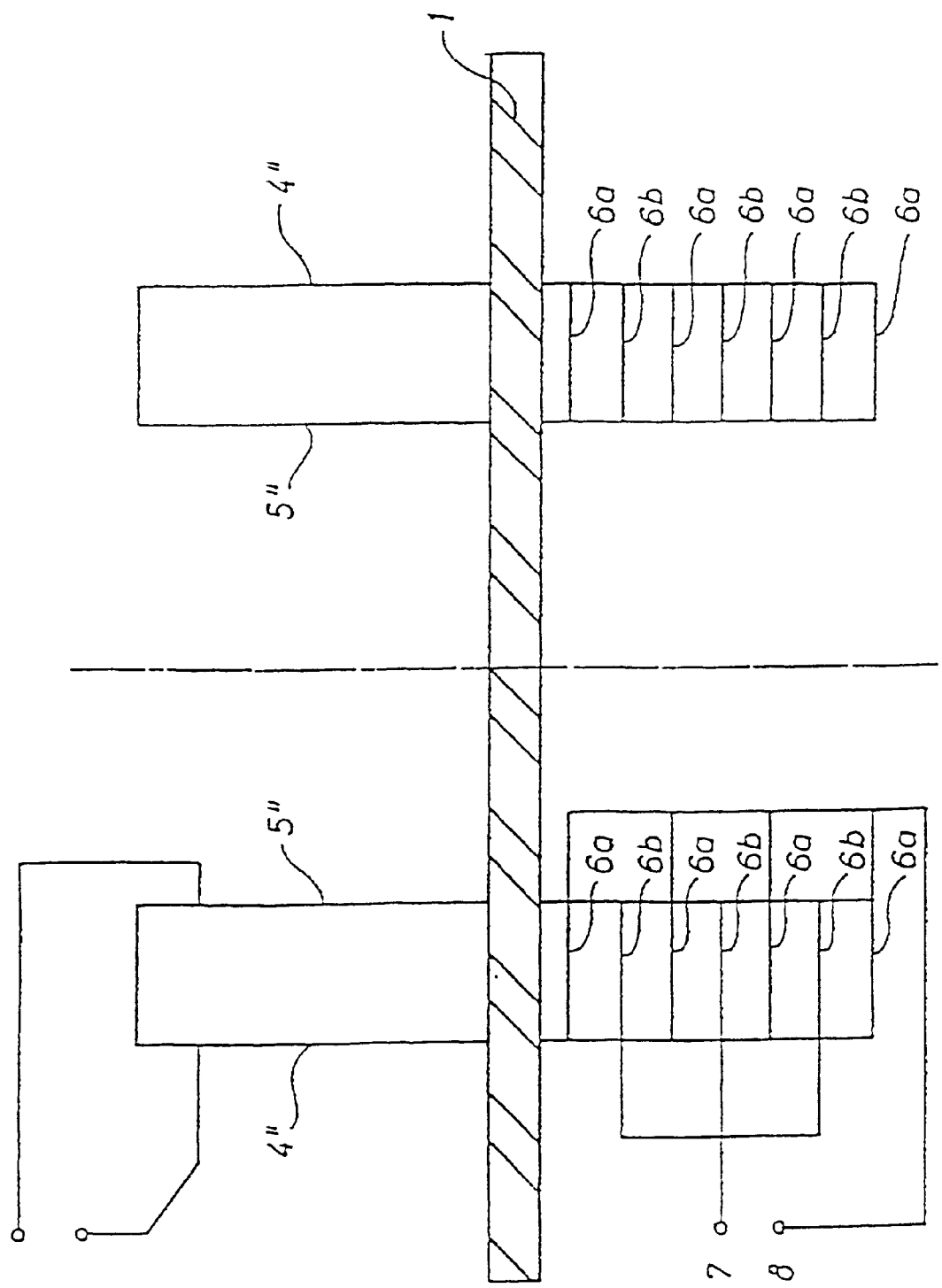
FIG. 6 is a sectional view corresponding to the sectional view of FIG. 5, where the inner electrode has been withdrawn so as to reduce the polarisation stresses.

FIG. 6 illustrates an alternative positioning of the primary electrodes, where the inner electrode has been withdrawn so as to reduce the polarisation stresses.

Figure 7:
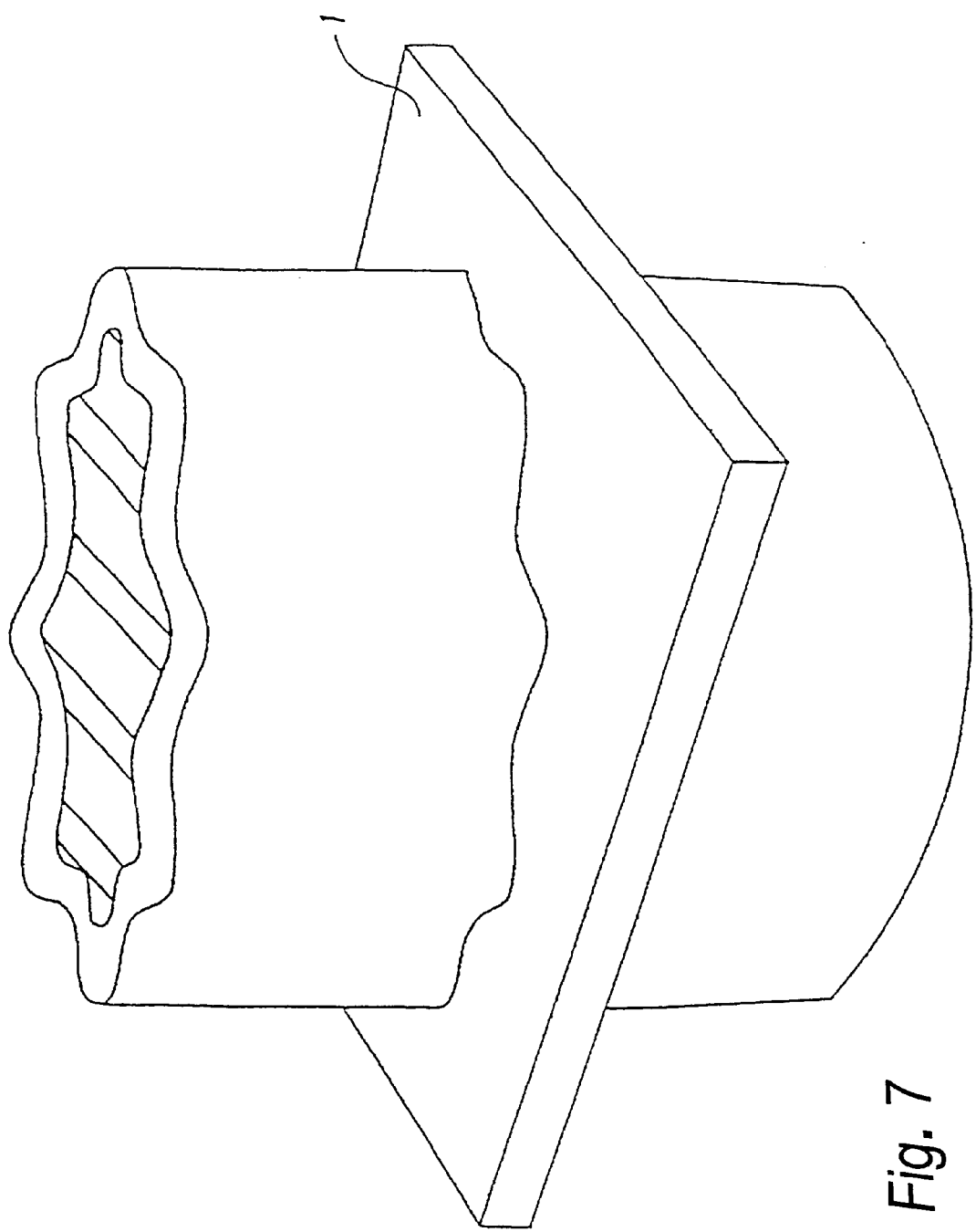
FIG. 7 illustrates an alternative embodiment of a piezoelectric transformer, where the annular piezoelectric body has a wavy closed shape.
Figure 8:
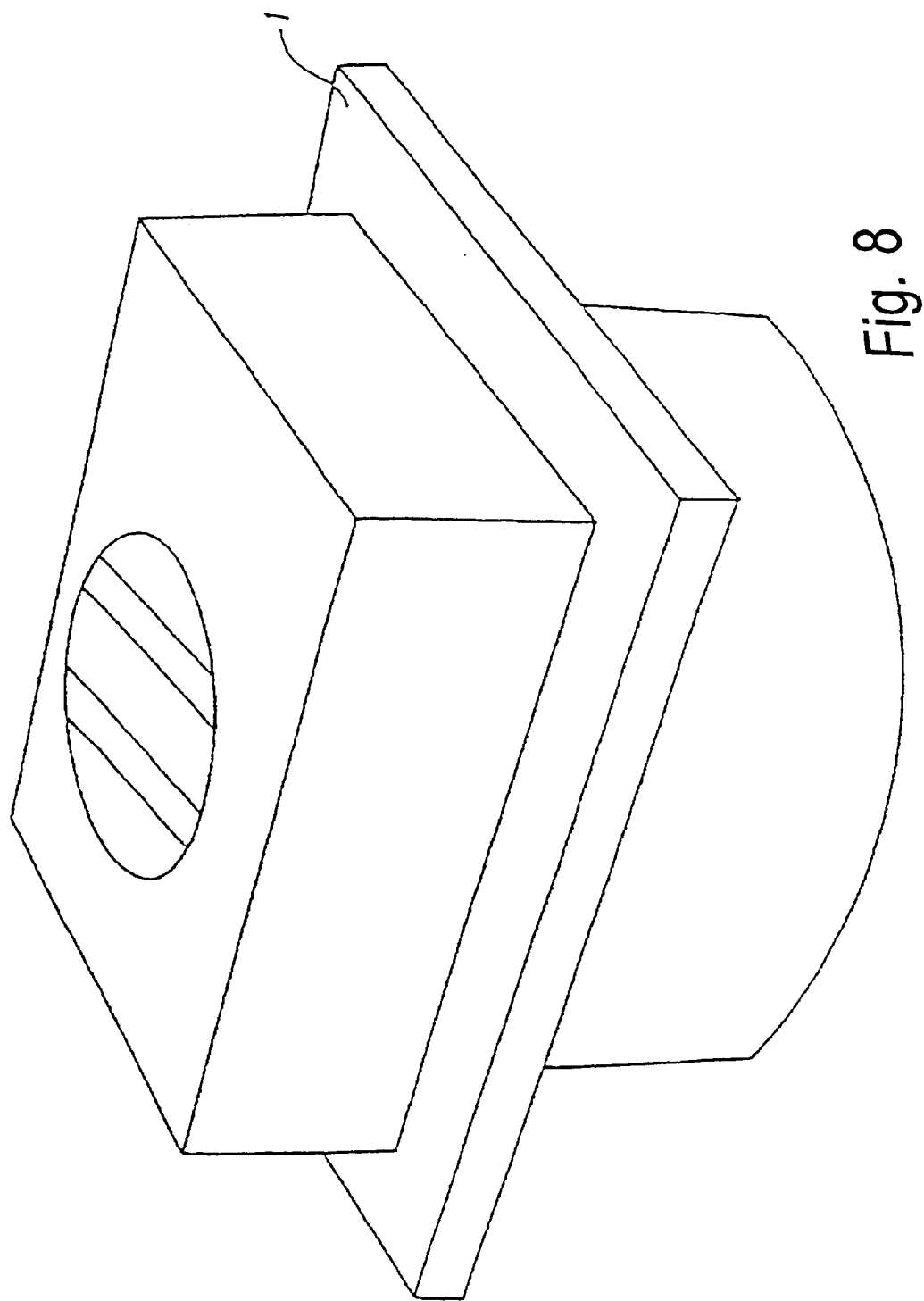
FIG. 8 illustrates an alternative embodiment of a piezoelectric transformer, where the primary portion is quadrangular and presents a circular opening.

FIGS. 7 and 8 illustrates alternative embodiments of the piezoelectric body.

The piezoelectric material is preferably a PZT ceramics. PZT is preferred because it has a relatively high dielectric constant and a relatively high coupling coefficient.

The transformer can for instance be used for transforming 120 VAC into 12 VAC. The piezoelectric transformer presents a relatively high energy density, e.g., up to 0.04 W/cm$^3$ kHz corresponding to a field intensity of 20 W/cm$^3$ at 500 kHz. Thus the component is suited for miniaturising.

Other things being equal, the latter results in a comparatively smaller component, which in turn means a reduced cost price. The increased operating frequency has also the effect that filter components (coils, capacitors) of the associated equipment can present lower values and consequently a reduced physical size as well as a reduced price.

The insulation between the primary and the secondary portions no longer depends on the leakage path along the surface of the transformer, but on the breakdown voltage in the insulating layer. Therefore, the reduced dimensions present no hindrance to meeting the same or higher requirements to the insulation.

The operating frequency may typically be about 500 kHz. The piezoelectric material may be NAVY type I or III. The external diameter may be about 10 mm and the internal diameter about 7 mm. Each part is of a length (height) of about 1.8 mm, and the two parts are separated by a round aluminium disk of a thickness of about 0.25 mm. The total length of the transformer may be 3.85 mm.

It is often advantageous to utilize the possibility of working with a high power, high $Q_m$ piezoelectric material (e.g., of the type of NAVY types I and III (DOD-STD-1376A (SH) Feb. 28, 1984)) and types of similar or higher $Q_m$, such as higher than 500 and higher than 800 ($Q_m$ is a measure of mechanical quality of piezoelectric materials, such as, e.g. the above-mentioned Ferroperm product having a $Q_m$ of 1000, determined as defined in the standard. On the other hand, there may also be applications where a lower $Q_m$, such as about 300, is suitable.

The transformers illustrated in the drawings above are transformers in which one part is a multilayer component while the other part is a bulk component. It is, however, also possible that both components are either bulk or multilayer components, depending on the desired voltage ratio and the impedance conditions to which the transformer is to be adapted. Bulk components are less expensive than multilayer components and it is possible with bulk components to obtain a voltage ratio of up to 1:3 by employing materials presenting a varying permittivity on the primary and the secondary portions.

Furthermore it is possible to use an either triangular or quadrangular blank with a round opening instead of the cylindrical blank, cf. FIG. 10. The opening is asymmetrically positioned so as to further attenuate undesired resonances. Quadrangles can be cut out in a cost-saving manner, and it is easy to drill round openings.

The generally preferred shape of the piezoelectric body is the shape of a circular cylinder with a concentric circular cylindrical through-going opening, but is is evident that there may be many variations hereof, including embodiments where the cylinder is oval, in which case the opening may be concentrically oval or circular, for example.

It will be understood that the opening could in some cases consist of a plurality of openings together constituting what will function substantially as one opening. In this case, the transverse dimension of the opening should be considered to be the transverse dimension of the group of openings together constituting the opening of this special embodiment of the annular body. As mentioned above, it is preferred that the resonance frequency of a dimension of a cross-section of the annular body substantially perpendicular to the peripheral direction of the annular body is a resonance frequency of the thickness of the annular body, corresponding to the height of the walls of the annular body.

While it is often preferred that the primary and the secondary portions of the piezoelectric body have been polarized in the thickness direction of the piezoelectric body, it is also possible to have, e.g., the primary portion of the annular piezoelectric body substantially radially polarized.

For some purposes, it may be advantageous that the annular piezoelectric body is shaped as a double cone having its largest diameter at or close to the middle of the body, or that the opening is shaped as a double cone having its smallest diameter at or close to the middle of the body.

The ratio o/b between the transverse dimension o of the opening of the annular body and the width b of the wall part of the body surrounding the opening is preferably at least 0.5, such as at least 1, at least 1.5, at least 3 or at least 4 or 5. There is not really any particular upper limit for the ratio, but in practice, the ratio will very often be in the range of 1–5.

Figure 13:
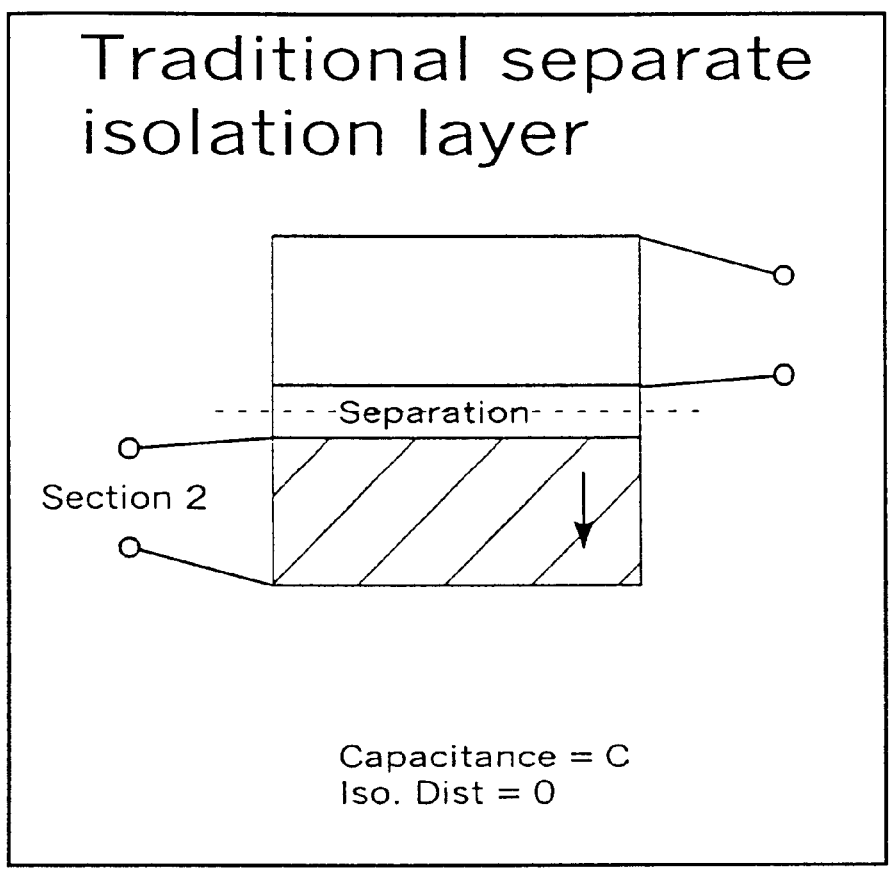
FIG. 13 illustrates a conventional way of establishing galvanic separation in piezoelectric transformers, including piezoelectric transformers of the invention.

The piezoelectric transformer of the invention may contain a separate galvanic separation layer between the primary and the secondary portions. This is illustrated in FIG. 13 which shows an example where the input electrodes are placed on the surface of the portion having a capacitance equal to C and no isolation distance to its neighbour portion; poling as indicated by the arrows or reversed.

Figure 14:
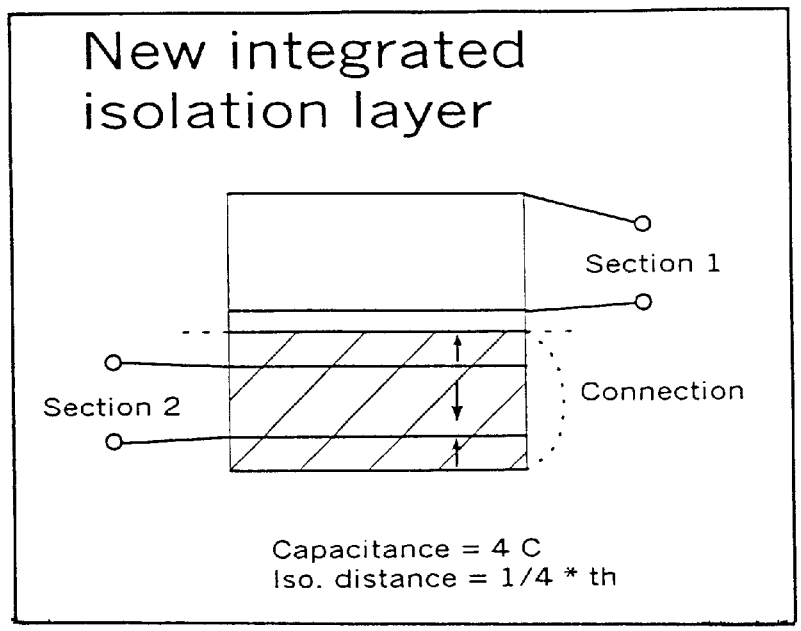
FIGS. 14–15 illustrate an advantageous new concept where galvanic separation is obtained by use of the active piezoelectric material for galvanic separation, this concept being useful in the piezoelectric transformers of the invention and quite generally in all types of piezoelectric transformers.

On the other hand, an interesting possibility is to have the electrodes of one or both portions of the piezoelectric body embedded in their respective portion, in which case the piezoelectric material between the respective other portion and the embedded electrode which is closest to that other portion is used as a galvanic separation while still actively participating in the power transfer. This is illustrated in FIG. 14 which shows the electrodes being embedded one quarter of the thickness from the surface. Top and bottom surfaces have been provided with electrically floating electrodes interconnected by means of an external connection. In this way, it is possible to obtain an isolation distance equal to the distance between inner and outer electrodes, i.e., about one quarter times the total thickness of the portion. The poling as indicated by the arrows or reverse. The capacitance is, at the same time increased to 4C.

Figure 15:
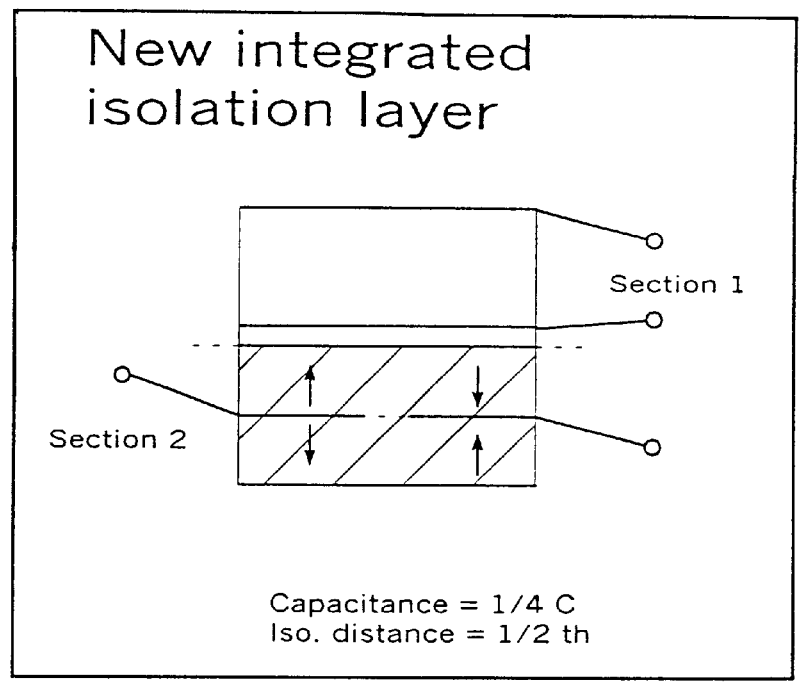

Another embodiment of this aspect of the invention is illustrated in FIG. 15 which shows the electrodes being positioned in the center of the portion, sharing the cross-section equally between them. The two outer surfaces are individually electroded with electrically floating electrodes. The isolation distance equals one half the portion thickness, capacitance ¼C. The poling as indicated by the arrows or reverse.

It will be understood that this aspect of embedded electrodes making it possible to have the galvanic separation constituted by active piezoelectric material is not limited to the annular transformers according to the invention, but rather is useful in connection with any type of piezoelectric transformer where galvanic separation is desired.

What is claimed is:

1. A piezoelectric transformer comprising a piezoelectric body which comprises a primary portion and a secondary portion, both the primary portion and the secondary portion being able to generate and transform piezoelectric vibrations in accordance with an AC Voltage fed to one portion while a transformed voltage can be delivered from the other portion, the piezoelectric body being constituted by a substantially annular body the primary and secondary portions of which have been polarized substantially perpendicular to the peripheral direction of the annular body, the transformer being adapted to be operated at a resonance frequency of a dimension of a cross-section of the annular body substantially perpendicular to the peripheral direction of the annular body.

2. A piezoelectric transformer according to claim 1, wherein the substantially annular body is an annular body.

3. A piezoelectric transformer according to claim 2, wherein the resonance frequency of a dimension of a cross-section of the annular body substantially perpendicular to the peripheral direction of the annular body is a resonance frequency of the thickness of the annular body.

4. A piezoelectric transformer according to claim 1, wherein the primary and the secondary portions of the piezoelectric body have been polarized in the thickness direction of the piezoelectric body.

5. A piezoelectric transformer as claimed in claim 1, wherein the primary portion of the annular piezoelectric body has been substantially radially polarized.

6. A piezoelectric transformer as claimed in claim 1, wherein the secondary portion is provided with a plurality of inner electrodes.

7. A piezoelectric transformer as claimed in claim 1, wherein the piezoelectric body is annular, having a through-going opening defined therein.

8. A piezoelectric transformer as claimed in claim 7, wherein the opening is a through-going opening in the thickness direction of the body.

9. A piezoelectric transformer as claimed in claim 8, wherein the annular piezoelectric body is shaped as a hollow circular cylindrical body, the opening being a circular cylindrical opening having substantially the same center as the cylindrical body.

10. A piezoelectric transformer as claimed in claim 8, wherein the annular piezoelectric body is shaped as a double cone having its largest diameter at or close to the middle of the body.

11. A piezoelectric transformer as claimed in claim 8, wherein the opening is shaped as a double cone having its smallest diameter at or close to the middle of the body.

12. A piezoelectric transformer as claimed in claim 1, wherein a ratio b/h between width b of the wall of the annular body and a height h of the wall of the annular body (the height h being the thickness of the annular body) is at the most 0.25.

13. A piezoelectric transformer as claimed in claim 1, wherein a ratio b/h is between 0.35 and 0.8.

14. A piezoelectric transformer as claimed in claim 1, wherein a ratio b/h is between 0.4 and 0.7.

15. A piezoelectric transformer as claimed in claim 1, wherein a ratio o/b between a transverse dimension o of the opening of the annular body and a width b of the wall part of the body surrounding the opening is at least 0.5.

16. A piezoelectric transformer as claimed in claim 15, wherein a ratio o/b between a transverse dimension o of the opening of the annular body and a width b of the wall part of the body surrounding the opening is at least 1.

17. A piezoelectric transformer as claimed in claim 1, wherein a ratio o/b between a transverse dimension o of the opening of the annular body and a width b of the wall part of the body surrounding the opening is at least 1.5.

18. A piezoelectric transformer as claimed in claim 1, wherein a ratio o/b between a transverse dimension o of the opening of the annular body and a width b of the wall part of the body surrounding the opening is at least 2.

19. A piezoelectric transformer as claimed in claim 1, wherein a ratio o/b between a transverse dimension o of the opening of the annular body and a width b of the wall part of the body surrounding the opening is at least 3.

20. A piezoelectric transformer as claimed in claim 1, wherein a ratio o/b between a transverse dimension o of the opening of the annular body and a width b of the wall part of the body surrounding the opening is at least 5.

21. A piezoelectric transformer as claimed in claim 1, wherein a ratio o/b between a transverse dimension o of the opening of the annular body and a width b of the wall part of the body surrounding the opening is in the interval of 1–5.

22. A piezoelectric transformer as claimed in claim 1, which contains a separate galvanic separation layer between the primary and the secondary portions.

23. A piezoelectric transformer as claimed in claim 1, wherein electrodes of one or both portions of the piezoelectric body are embedded in their respective portion, and the piezoelectric material between the respective other portion and the embedded electrode which is closest to that other portion is used as a galvanic separation while still actively participating in the power transfer.

24. A piezoelectric transformer comprising a piezoelectric body which comprises a primary portion and a secondary portion, both the primary portion and the secondary portion being able to generate and transform piezoelectric vibrations in accordance with an AC Voltage fed to one portion while a transformed voltage can be delivered from the other portion, electrodes of one or both portions of the piezoelectric body being embedded in their respective portion, and piezoelectric material between the respective other portion and the embedded electrode which is closest to that other portion is used as a galvanic separation while still actively participating in the power transfer.

* * * * *

UNITED STATES PATENT AND TRADEMARK OFFICE
CERTIFICATE OF CORRECTION

| | | Page 1 of 1 |
|---|---|---|
| PATENT NO. | : 6,707,235 B1 | |
| APPLICATION NO. | : 09/659490 | |
| DATED | : March 16, 2004 | |
| INVENTOR(S) | : Klaus Brebol | |

It is certified that error appears in the above-identified patent and that said Letters Patent is hereby corrected as shown below:

Please insert the priority data on the Title Page as shown:

--(22) PCT Filed: Mar. 2, 1999
 (86) PCT No.: PCT/DK99/00096

§ 371(c)(1),
 (2), (4) Date: Mar. 2, 1999

(87) PCT Pub. No.: WO 1999/45600

PCT Pub. Date: Sep. 10, 1999

Related U.S. Application Data

(63) Continuation-in-part of Application No. 09/623,365,
 filed on September 1, 2000

(30) Foreign Application Priority Data
 Mar. 3, 1998 (DK) .................0284/98--

On page 1, after the title, insert:

--This application is a continuation-in-part of Application Serial No. 09/623,365, filed Sep. 1, 2000, now abandoned, which is the national phase under 35 USC § 371 of PCT Application No. PCT/DK99/00096 filed on Mar. 2, 1999 which designated the United States of America, and which claims priority from Danish Patent Application No. 0284/98, filed Mar. 3, 1998, the entire contents of each of which are hereby incorporated herein by reference.--

Signed and Sealed this
Thirteenth Day of September, 2011

David J. Kappos
*Director of the United States Patent and Trademark Office*